(12) United States Patent
Tiruchengode Tirumurugga Bupathi et al.

(10) Patent No.: US 11,509,217 B2
(45) Date of Patent: *Nov. 22, 2022

(54) STABLE DIGITAL INTEGRATOR CIRCUIT FOR BOOST CONVERTER

(71) Applicant: TEXAS INSTRUMENTS INCORPORATED, Dallas, TX (US)

(72) Inventors: Anandha Ruban Tiruchengode Tirumurugga Bupathi, Tiruchengode (IN); Anand Kannan, Bengaluru (IN); Dileep Kumar Ramesh Bhat, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/950,346

(22) Filed: Nov. 17, 2020

(65) Prior Publication Data

US 2021/0075320 A1 Mar. 11, 2021

Related U.S. Application Data

(63) Continuation of application No. 16/667,130, filed on Oct. 29, 2019, now Pat. No. 10,873,259.

(30) Foreign Application Priority Data

Oct. 31, 2018 (IN) .............................. 201841041178

(51) Int. Cl.
*H02M 3/157* (2006.01)
*H04R 3/02* (2006.01)
*H03M 1/78* (2006.01)

(52) U.S. Cl.
CPC .............. *H02M 3/157* (2013.01); *H04R 3/02* (2013.01); *H03M 1/785* (2013.01)

(58) Field of Classification Search
CPC .......... H02M 3/157; H04R 3/02; H03M 1/785
USPC ............... 323/282, 271, 283, 285, 234, 280; 326/93; 381/58, 83, 93, 120–121
See application file for complete search history.

(56) References Cited

U.S. PATENT DOCUMENTS

| 2002/0145552 | A1* | 10/2002 | Gorman | H03M 1/765 341/145 |
| 2009/0237051 | A1* | 9/2009 | Saitoh | H02M 3/156 323/282 |
| 2010/0217414 | A1* | 8/2010 | Sanders | G08C 25/02 700/94 |
| 2013/0300388 | A1* | 11/2013 | Laur | H02M 3/156 323/282 |
| 2017/0346446 | A1* | 11/2017 | May | H03F 3/187 |

* cited by examiner

*Primary Examiner* — Norman Yu
(74) *Attorney, Agent, or Firm* — Michael T. Gabrik; Charles A. Brill; Frank D. Cimino

(57) ABSTRACT

An electrical device includes an integrated circuit having device circuitry and a boost converter coupled to the device circuitry. The boost converter includes a digital integrator circuit having: a first comparator; a second comparator; a counter configured to count up, count down, and pause based on a first output signal provided by the first comparator and based on a second output signal provided by the second comparator; and a digital-to-analog converter (DAC) configured to provide a feedback adjustment signal for the boost converter based on a count value provided by the counter.

11 Claims, 12 Drawing Sheets

STABLE DIGITAL INTEGRATOR CIRCUIT FOR BOOST CONVERTER

CROSS-REFERENCE TO RELATED APPLICATIONS

This continuation application claims priority to U.S. patent application Ser. No. 16/667,130, filed Oct. 29, 2019, which claims priority to Indian Provisional Application No. 201841041178, filed Oct. 31, 2018, both of which are incorporated herein by reference in their entirety.

BACKGROUND

There are many different electrical system designs, each appropriate for a given scenario. Efforts to improve on electrical system designs and components are ongoing and involve commercialization of different system components. The use of semiconductor technology and the proliferation of consumer and industrial applications for semiconductor-based circuits drive product development. In summary, there is a competition to provide low-cost and functional electrical system components for use in consumer and industrial applications around the world.

Power management circuits are needed for many electrical system designs. In particular, the proliferation of mobile battery-operated devices is tied to the commercialization of power management circuits. One type of power management circuit is referred to as a switching converter. In a switching converter, the output voltage is a function of the input voltage and the switching operations of one or more switches. One benefit of a switching converter is its ability to respond to a variable load.

One example of a switching converter is referred to as a boost converter because the output voltage is higher than the input voltage. Providing a stable output voltage in presence of a variable load is a difficult task. The voltage regulation of a boost converter and the offset (relative to a target reference) in the output voltage caused by the addition of a saw tooth signal for slope compensation depends on the DC loop gain of the boost converter. To achieve high DC accuracy in a boost converter, very high DC loop gain is used. One technique to achieve this high DC loop gain involves a pole-zero pair with the pole positioned at DC and the zero positioned ¼ to ⅕ times the unity gain bandwidth (UGB). To have good phase margin, a capacitance of the order of nano farads may be used on chip to realize the necessary zero location. However, a semiconductor capacitor of this size is undesirable. Efforts to efficiently provide regulation stability for a boost converter are ongoing.

SUMMARY

In accordance with at least one example of the disclosure, an electrical device comprises an integrated circuit having device circuitry and a boost converter coupled to the device circuitry. The boost converter comprises a digital integrator circuit having a first comparator and a second comparator. The digital integrator circuit also comprises a counter configured to count up, count down, and pause based on a first output signal provided by the first comparator and based on a second output signal provided by the second comparator. The digital integrator circuit also comprises a digital-to-analog converter (DAC) configured to provide a feedback adjustment signal for the boost converter based on a count value provided by the counter.

In accordance with at least one example of the disclosure, a boost converter circuit comprises a power switch and a control circuit coupled to the power switch. The control circuit comprises a digital integrator circuit having a first comparator with input nodes and an output nod. The digital integrator circuit also comprises a second comparator two input nodes and an output node. The digital integrator circuit also comprises a counter with a first input node coupled to the output node of the first comparator and with a second input node coupled to the output node of the second comparator. The digital integrator circuit also comprises a DAC coupled to an output node of the counter, wherein an output of the DAC is a feedback adjustment signal used by the control circuit to determine an on-time for the power switch.

In accordance with at least one example of the disclosure, a method comprises receiving an input voltage. The method also comprises receiving a target reference for an output voltage. The method also comprises providing a feedback adjustment signal for an inner loop of a boost converter based on a digital counter with a count up function, a count down function, and a pause function. The method also comprises regulating the output voltage of the boost converter based on the input voltage and the adjusted feedback adjustment signal.

BRIEF DESCRIPTION OF THE DRAWINGS

For a detailed description of various examples, reference will now be made to the accompanying drawings in which.

DETAILED DESCRIPTION

Disclosed herein are boost converter topologies with a digital integrator circuit configured to provide a settled output. In some examples, a digital integrator circuit includes a first comparator and a second comparator. The digital integrator also includes a counter configured to count up, count down, and pause based on a first output signal provided by the first comparator and based on a second output signal provided by the second comparator. The digital integrator circuit also comprises a digital-to-analog converter (DAC) configured to provide a feedback adjustment signal for a boost converter based on a count value provided by the counter. This feedback adjustment signal is the settled output of the digital integrator circuit. With the disclosed digital integrator circuit, an analog capacitor and related multiplier circuit is avoided, which saves area and facilitates on-chip boost converter solutions. Also, the disclosed digital integrator circuit avoids overshoot in the output voltage of a boost converter and provides desired stability and performance. To provide a better understanding, various boost converter options, digital integrator circuit options, and related system options are described using the figures as follows.

Figure 1:
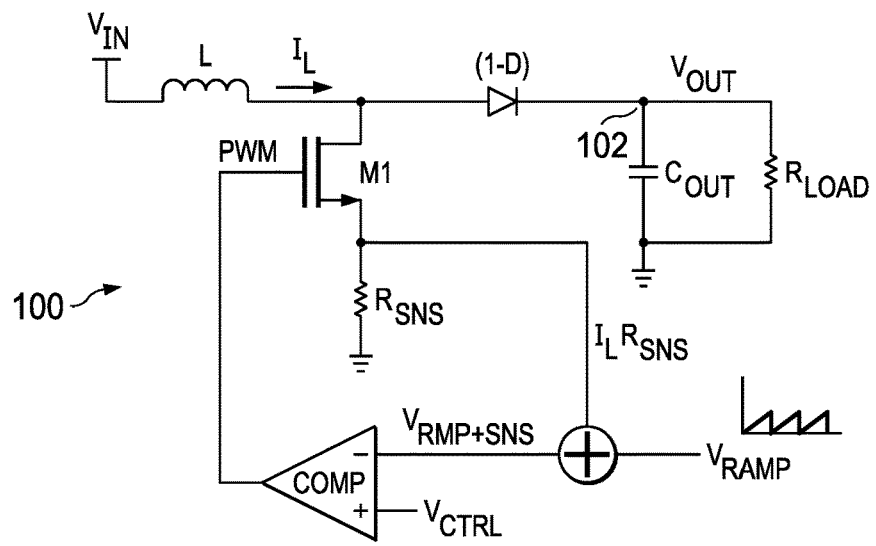
FIGS. 1-4 are schematic diagram showing boost converter topologies in accordance with some examples.

FIGS. 1-4 are schematic diagram showing boost converter topologies in accordance with some examples. In FIG. 1, the boost converter topology 100 includes a switch (M1) with a first current terminal, a second current terminal, and a control terminal. As shown, the first current terminal of M1 is coupled to an inductor (L). More specifically, a first end of L is coupled to an input voltage supply ($V_{IN}$) node, and a second end of L is coupled to the first current terminal of M1. Meanwhile, the second current terminal of M1 is coupled to a ground node via a sense resistor ($R_{SNS}$). Also, the control terminal of M1 is coupled to the output of a comparator ("Comp"), which corresponds to a pulse-width modulation (PWM) signal. In the example of FIG. 1, the PWM signal output from Comp is based on two inputs, $V_{RMP+SNS}$ and $V_{CTRL}$, where $V_{RAMP+SNS}$ combines a ramp voltage ($V_{RAMP}$) and a sense voltage ($V_{SNS}$, where $V_{SNS}=I_L R_{SNS}$), and where $V_{CTRL}$ is a reference voltage. The boost converter topology 100 also includes a diode (represented as "1-D", where D is the duty cycle of the PWM signal) between the second end of L and an output node 102, where the voltage at the output node is $V_{OUT}$. The diode of FIG. 1 corresponds to a voltage drop, but also acts like a switch which will allow current only in one direction and block the current in reverse direction. In the boost converter topology 100, when the main FET (M1 in FIG. 1) is on, the diode will automatically turn off and when M1 is off, the diode will automatically turn on. Hence, if M1 turns on for a duty cycle of D, then the diode will be on for a duty cycle of (1-D) in a given period. Hence, if the average inductor current is $I_L$, then $(1-D)*I_L$ will be the average current flowing through $R_{OUT}$ (FIG. 1). Hence it is modelled as an attenuation factor of (1-D).

As shown, the boost converter topology 100 also includes an output capacitor ($C_{OUT}$) is coupled between the output node 102 and a ground node to store $V_{OUT}$ for use by a load ($R_{LOAD}$), which is also coupled between the output node 102 and the ground node. In operation, the inductor current ($I_L$) is converted into $V_{SNS}$, which is compared against $V_{CTRL}$ by Comp. Due to Comp, $I_L$ is limited to $V_{CTRL} R_{SNS}$. Also, $V_{RAMP}$ is added to $V_{SNS}$ to prevent sub-harmonic oscillations.

Figure 2:
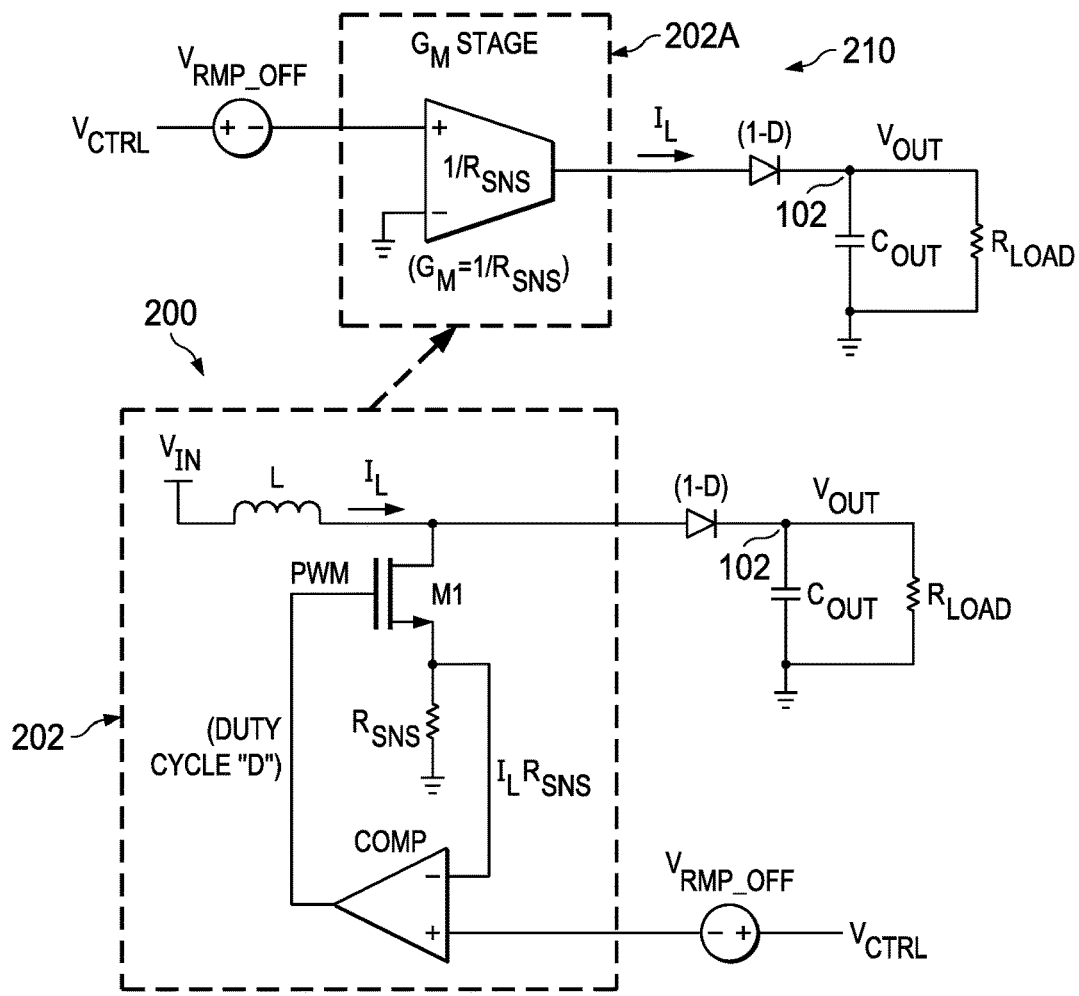

In FIG. 2, boost converter topologies 200 and 210 are represented, where the boost converter topologies 200 and 210 include many of components introduced for the boost converter topology 100 of FIG. 1. In the boost converter topology 200, an offset due to $V_{RAMP}$ is represented as being applied to $V_{CTRL}$ based on a control signal ($V_{RMP\_OFF}$). In the boost converter topology 200, the $V_{IN}$ node, M1, $R_{SNS}$, and Comp are represented as components of a current control loop 202. Meanwhile, in the boost converter topology 210, a transconductance ($G_M$) stage 202A replaces the current control loop 202 as a small signal equivalent, where $G_M=1/R_{SNS}$.

Figure 3:
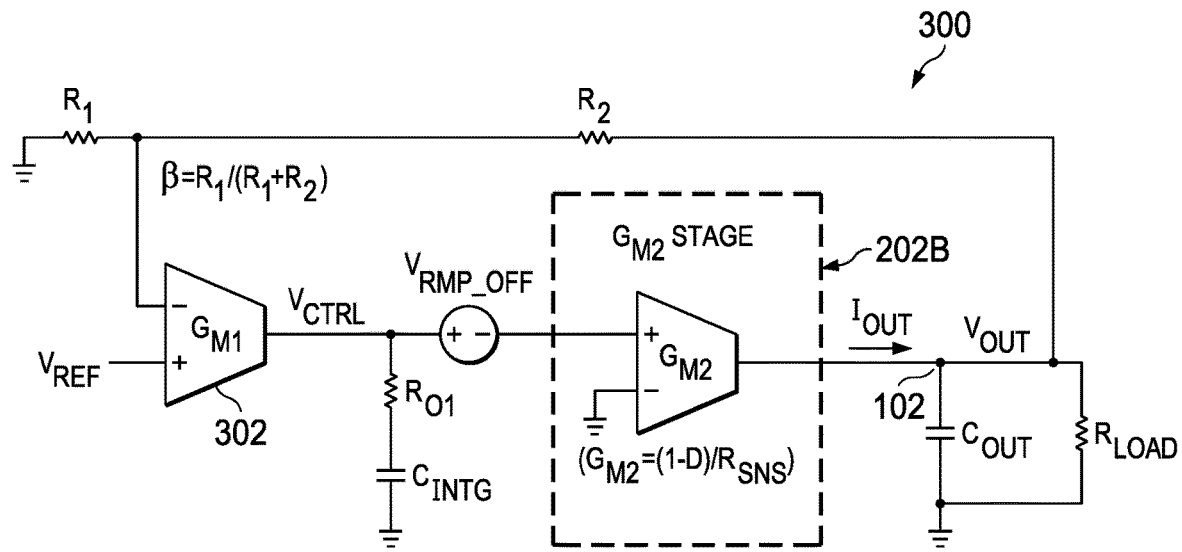

In FIG. 3, a boost converter topology 300 with a complete control loop is represented. As shown, the boost converter topology 300 includes a first stage 302 ($G_{M1}$) and a second $G_M$ stage 202B (an example of the $G_M$ stage 202 in FIG. 2). In operation, the first $G_M$ stage 302 along with $R_{O1}$ and $C_{INTG}$ correspond to an analog integrator for the boost converter topology 300. Also, the second $G_M$ stage 202B provides a $G_{M2}=((1-D)/R_{SNS})$. With the boost converter topology 300, the error in the boost output caused by the addition of a ramp signal (e.g., controlled by $V_{RMP\_OFF}$), load regulation, and random offsets depend on its DC loop gain. To achieve high accuracy in the boost converter topology, very high DC loop gain is used. This is typically achieved with a pole-zero pair, where the pole is positioned at DC (analog integrator) and the zero is positioned ¼ to ⅕ times the unity gain bandwidth (UGB). With the boost converter topology 300, the complete control loop regulates $\beta V_{OUT}$ exactly to $V_{REF}$, where $\beta=R_1/(R_1+R_2)$. Considering that boost needs to support a wide range of $R_{LOAD}$, $C_{OUT}$ and $V_{OUT}$, $C_{INTG}$ needs to be of the order of nano-farads to have a good phase margin.

Figure 4:
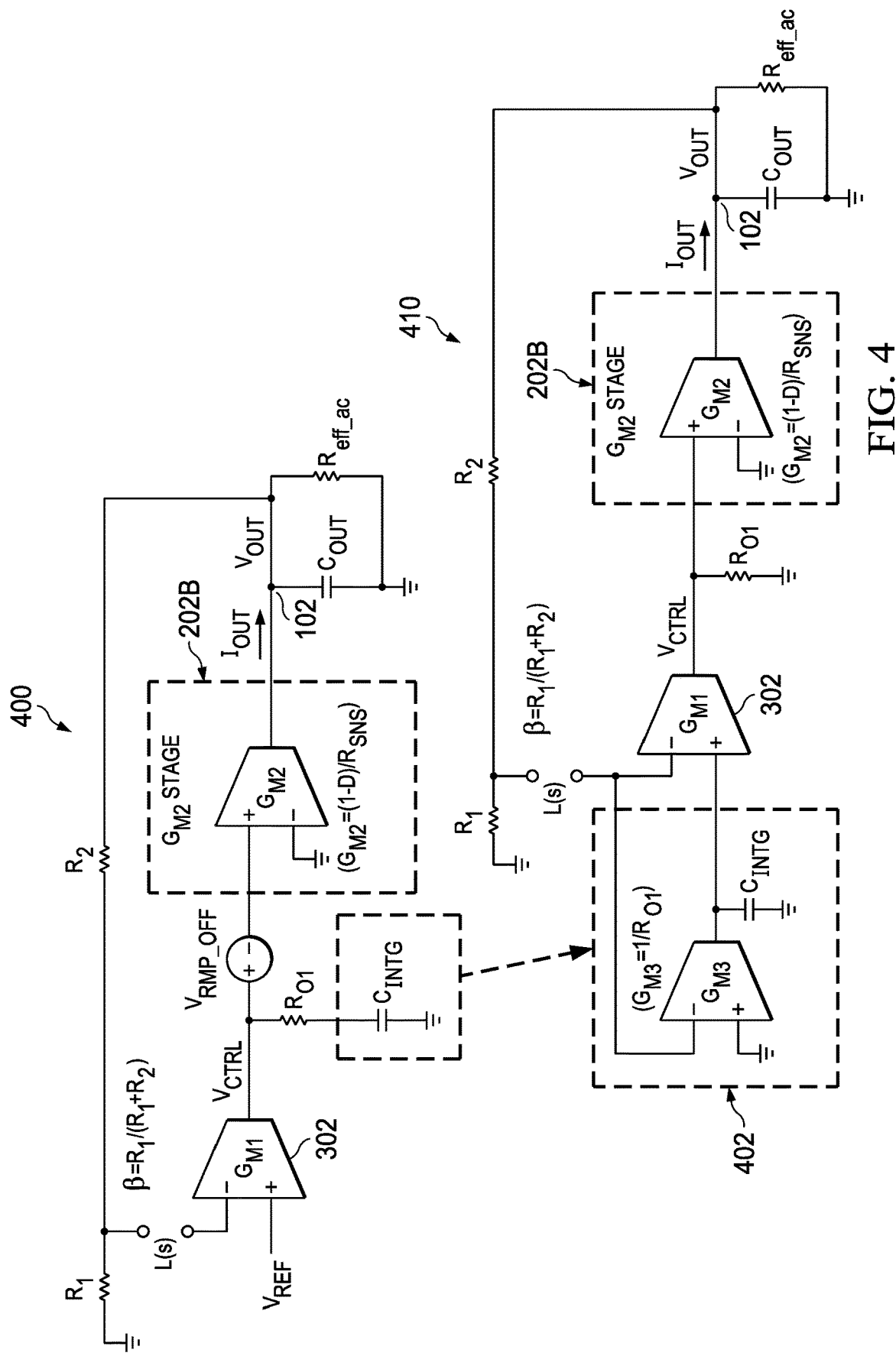

In FIG. 4, boost converter topologies 400 and 410 are represented. As shown, the boost converter topologies 400 and 410 includes many of the components represented in the boost converter topology 300. In FIG. 4, nodes for an inductor, L(s), are represented in the boost converter topologies 400 and 410. Also, $C_{INTG}$ in the boost converter topology 400 is isolated in the boost converter topology 410 using the integrator circuit 402. With the integrator circuit 402, the position of $C_{INTG}$ has been isolated and moved such that its value can be independently controlled without affecting the loop transfer function. In this manner, $C_{INTG}$ is able to be directly replaced by a digital circuit to avoid a large on-chip capacitance.

Figure 5B:
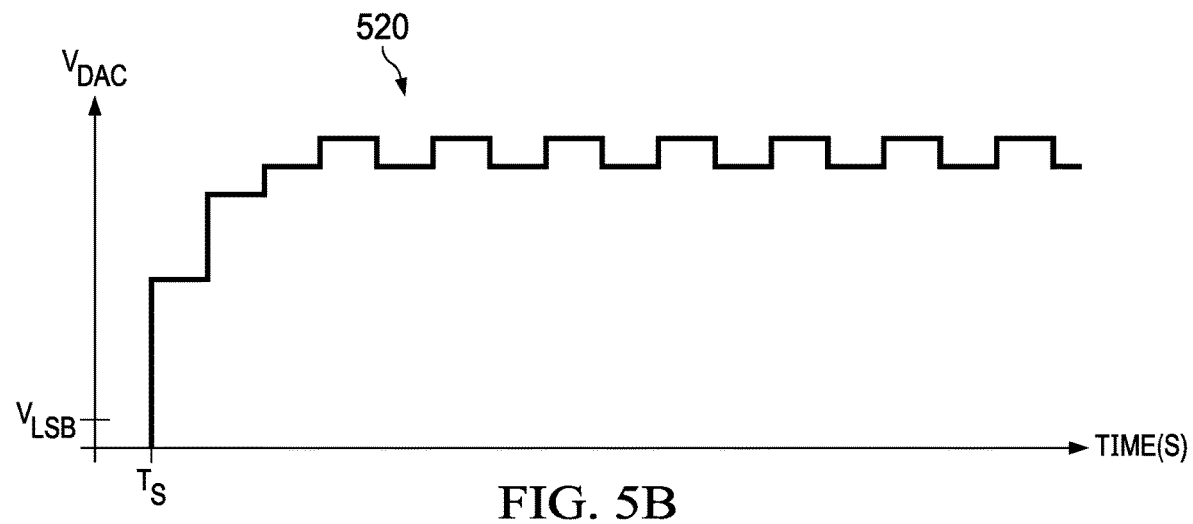
FIG. 5B is a timing diagram showing an output of the digital integrator of FIG. 5A in accordance with some examples.
Figure 5A:
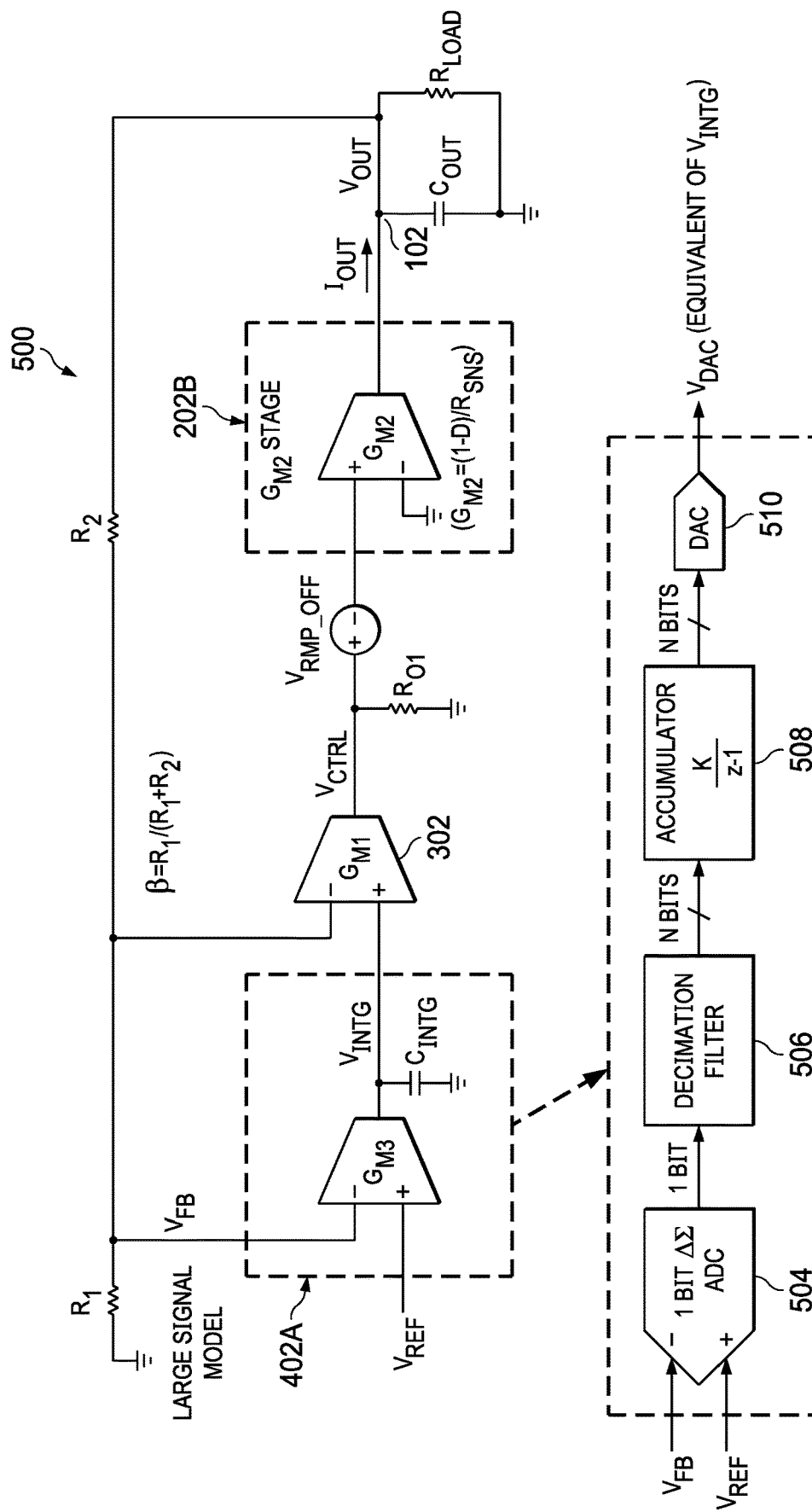
FIG. 5A is a schematic diagram showing a boost converter topology with a digital integrator in accordance with some examples.

FIG. 5A is a schematic diagram showing a boost converter topology 500 with a digital integrator 502 in accordance with some examples. As represented in FIG. 500, the digital integrator 502 replaces an analog integrator 402A (an example of the analog integrator 402 in FIG. 4). The other components of the boost converter topology 500 were previously introduced in FIGS. 1-4. In the boost converter topology 500, the digital integrator 502 converts the error signal into a digital signal using an analog-to-digital converter (ADC) 504. The digital integrator 502 also includes a decimation filter 506, an accumulator 508, and a DAC 510, where the output of the digital integrator 502 is $V_{INTG}$. The digital integrator 502 achieves approximately the same transfer function as an analog integrator, and supports exponential settling close to analog behavior and hence fast transients. However, the digital integrator 502 is a complex and hardware intensive solution and not many applications require fast transients and exponential settling if only DC error has to be corrected. As seen in the timing diagram 520 of FIG. 5B, the output of the digital integrator 502 of FIG. 5A does not settle and the LSB will keep toggling in steady state. Since the ADC 504 is a single bit $\Delta\Sigma$, it is highly susceptible to noise at the inputs, $V_{FB}$ and $V_{REF}$.

Figure 6A:
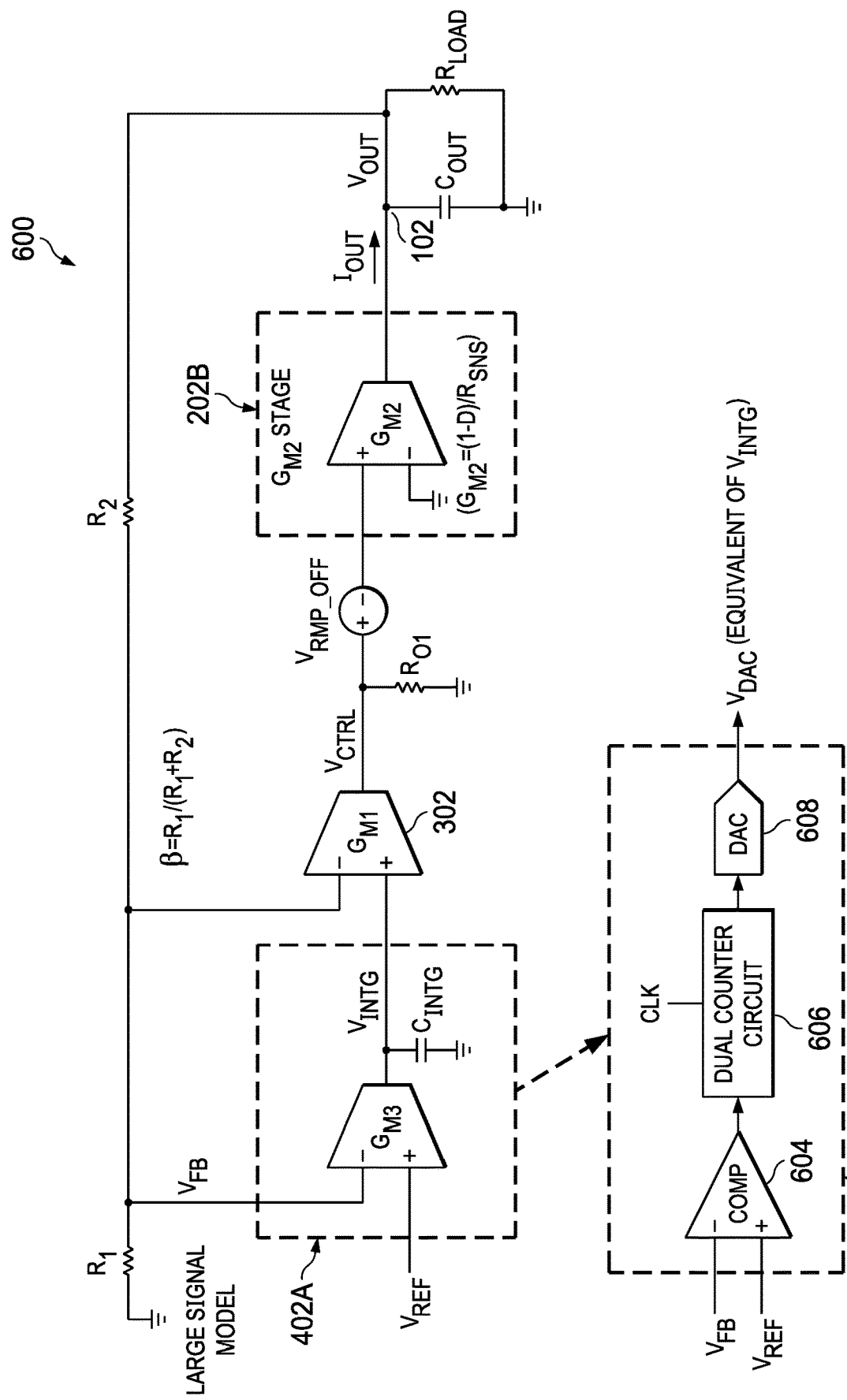
FIG. 6A is a schematic diagram showing another boost converter topology with a digital integrator in accordance with some examples.
Figure 6B:
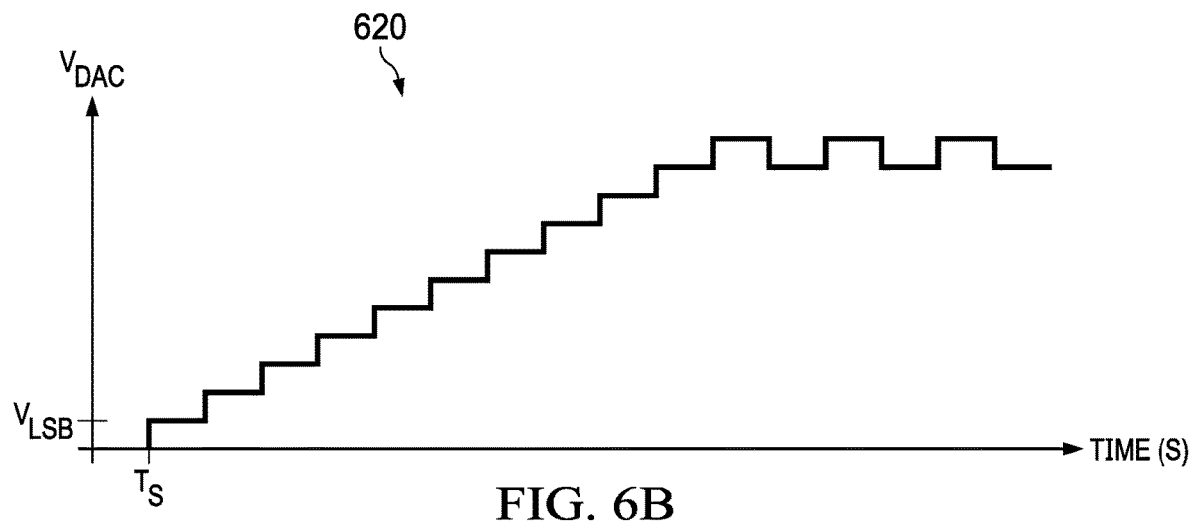
FIG. 6B is a timing diagram showing an output of the digital integrator of FIG. 6A in accordance with some examples.
Figure 6C:
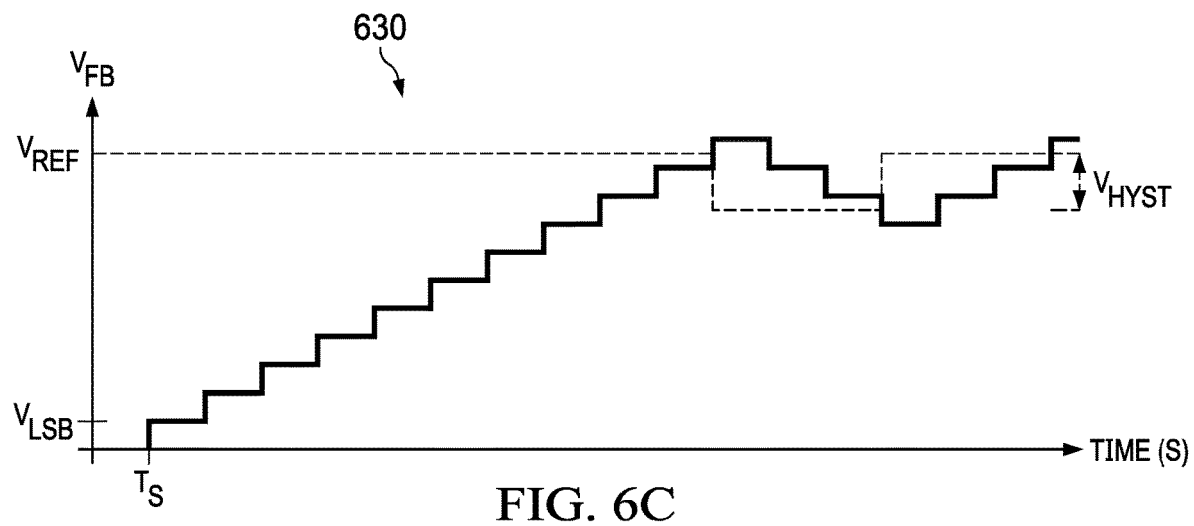
FIG. 6C is another timing diagram showing an output of a digital integrator in accordance with some examples.

FIG. 6A is a schematic diagram showing another boost converter topology 600 with a digital integrator 602 in accordance with some examples. The other components of the boost converter topology 600 were previously introduced in FIGS. 1-5. In the boost converter topology 600, the digital integrator 602 accounts for the error between $V_{FB}$ and $V_{REF}$ using a comparator 604, a dual counter circuit 606, and a DAC 608. The output of the DAC is $V_{DAC}$, which is equivalent to $V_{INTG}$. Compared to the digital integrator 502 of FIG. 5, the digital integrator 602 of FIG. 6 is less complex. However, as seen in the timing diagram 620 of FIG. 6B, the output of the digital integrator 602 of FIG. 6A does not settle and the LSB will keep toggling in steady state. Also, due to noise at $V_{FB}$ and $V_{REF}$, the comparator 604 is susceptible to unintentional triggering.

The issue of unintentional triggering can be resolved by adding hysteresis to the comparator 604. However, the hysteresis does not resolve the issue of the LSB of the DAC 608 toggling in steady state. In fact, the hysteresis can aggravate the problem such that more than one LSB toggling occurs during steady state as represented in the timing diagram 630 of FIG. 6C.

Figure 7B:
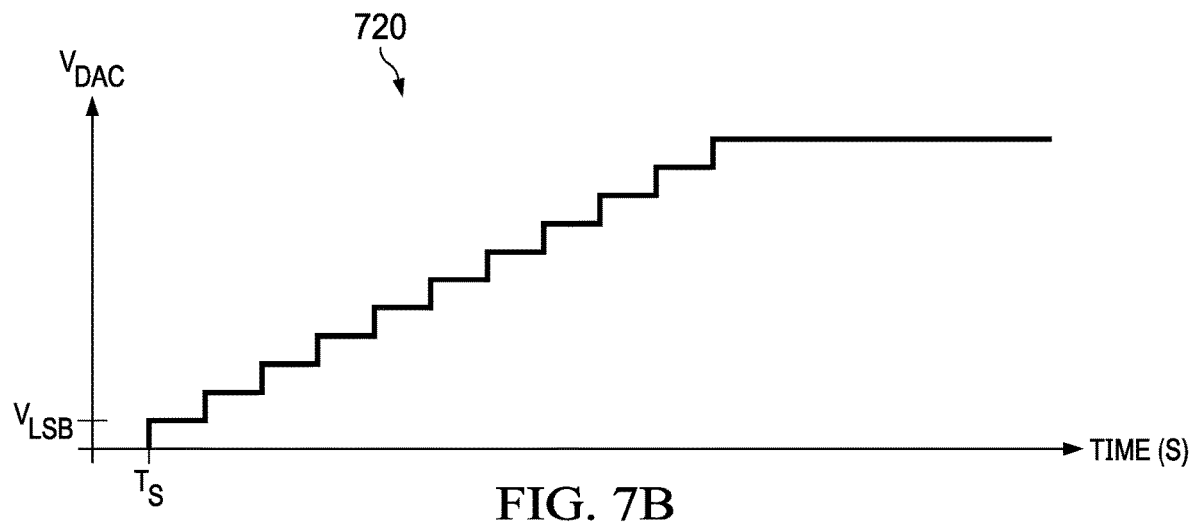
FIG. 7B is a timing diagram showing an output of the digital integrator of FIG. 7A in accordance with some examples.
Figure 7A:
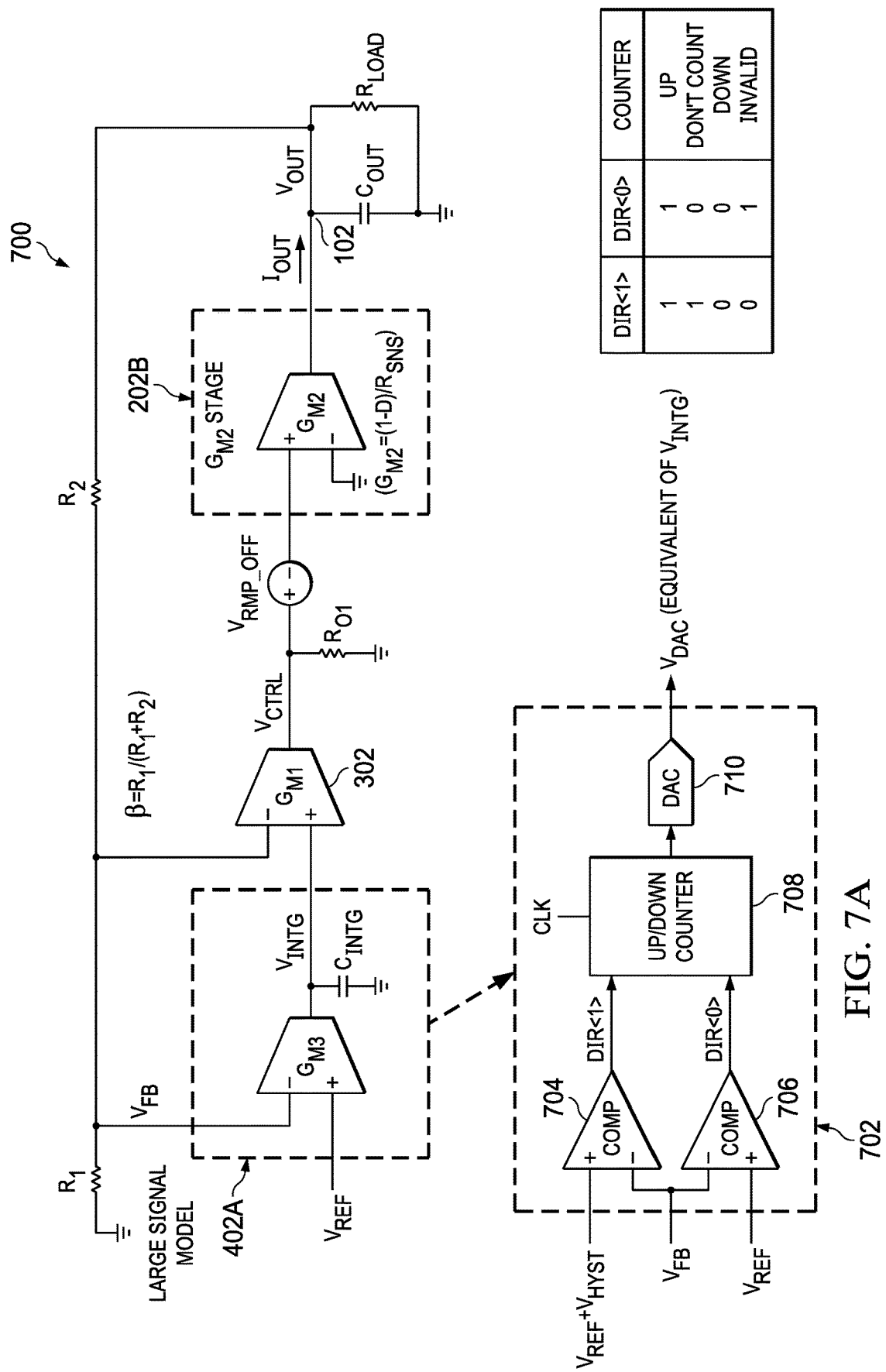
FIG. 7A is a schematic diagram showing another boost converter topology with a digital integrator in accordance with some examples.

FIG. 7A is a schematic diagram showing another boost converter topology 700 with a digital integrator 702 in accordance with some examples. The other components of the boost converter topology 700 were previously introduced in FIGS. 1-5. In the boost converter topology 700, the digital integrator 702 accounts for the error between $V_{FB}$ and $V_{REF}+V_{HYST}$ using a first comparator 704. The digital integrator 702 also accounts for the error between $V_{FB}$ and $V_{REF}$ using a second comparator 706. The outputs of the first and second comparators 704 and 706 are used as control signals ("DIR<1>" from the first comparator 704 and "DIR<2>" from the second comparator 706) for an up/down counter 708. In some examples, the operations of the up/down counter 708 correspond to Table 1 below.

TABLE 1

| DIR<1> | DIR<2> | Counter |
|---|---|---|
| 1 | 1 | Up |
| 1 | 0 | Don't Count/Freeze |
| 0 | 0 | Down |
| 0 | 1 | Invalid |

The output of the up/down counter 708 is input to a DAC 710, which provides $V_{DAC}$ as the output of the digital integrator 702, where $V_{DAC}$ is equivalent to $V_{INTG}$.

In some examples, the DAC 710 is reused to generate $V_{REF}$ and $V_{REF}+V_{HYST}$, hence $V_{HYST}$ can be as low as $2*\Delta V_{DAC}$ (Where $\Delta V_{DAC}$ is the LSB of the DAC 710). As described previously, the direction of the up/down counter 708 depends on the comparator outputs DIR<1> and DIR<2>. With the digital integrator 702, $V_{DAC}$ will settle to a value (see e.g., the timing diagram 720 of FIG. 7B) such that $V_{REF}<V_{FB}<V_{REF}+V_{HYST}$, where $V_{REF}$ and $V_{REF}+V_{HYST}$ are chosen such that their average is $\beta V_{SETTING}$. $V_{SETTING}$ is a user programmable setting. In some examples, a user has the ability to program the output voltage (e.g., 6V to 10V in 0.5V steps) of the boost converter using $V_{SETTING}$. While $V_{SETTING}$ is the ideal output voltage selected for the boost converter, $V_{OUT}$ is the actual output voltage of the boost converter. By choosing $V_{REF}$ and $V_{REF}+V_{HYST}$ such that their average is $\beta V_{SETTING}$, $V_{OUT}$ will settle between $V_{SETTING} \pm V_{HYST}/(2\beta)$. With $V_{HYST}=2*\Delta V_{DAC}$, $V_{OUT}$ will be within $V_{SETTING} \pm \Delta V_{DAC}/\beta$. In some examples, the period ($T_{CLK}$) of the clock signal (CLK) for the up/down counter 708 is programmable, and $T_{CLK}$ is selected to be at least 5 times higher than the worst case time constant of the inner loop (the network with $G_{M1}R_{O1}$, $G_{M2}$, $C_{OUT}R_{LOAD}$ and $\beta$ in FIG. 7A). In this manner, the inner loop reaches steady state at every DAC step and the first and second comparators 704 and 706 are able to make a decision for that step.

Figure 8:
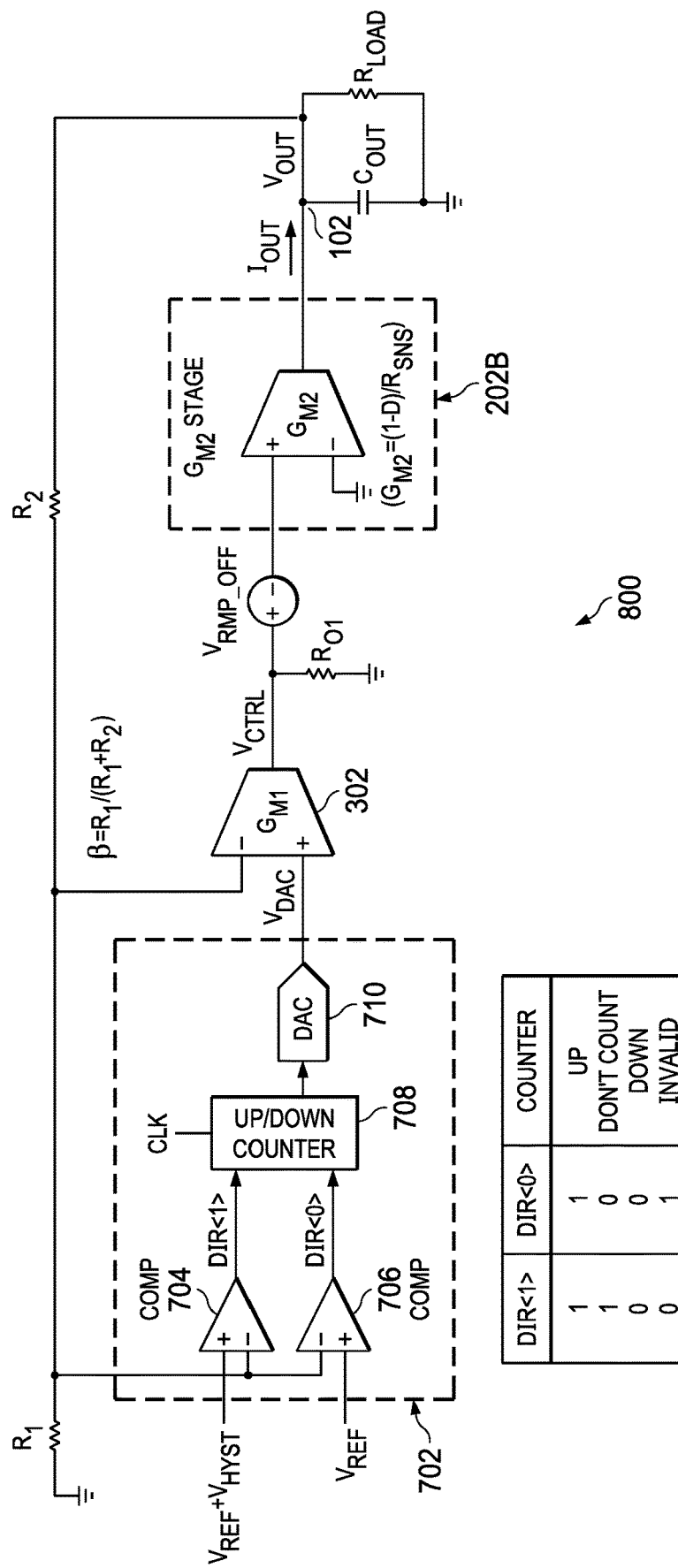
FIGS. 8, 9, 10A and 10B are schematic diagrams showing other boost converter topologies with a digital integrator in accordance with some examples.

FIG. 8 is a schematic diagram showing another boost converter topology 800 with the digital integrator 702 in accordance with some examples. In the boost converter topology 800, the digital integrator 702 has replaced the analog integrator 402A represented in the boost converter topology 700 of FIG. 7A. The other components of the boost converter topology 700 were previously introduced in FIGS. 1-5.

Figure 9:
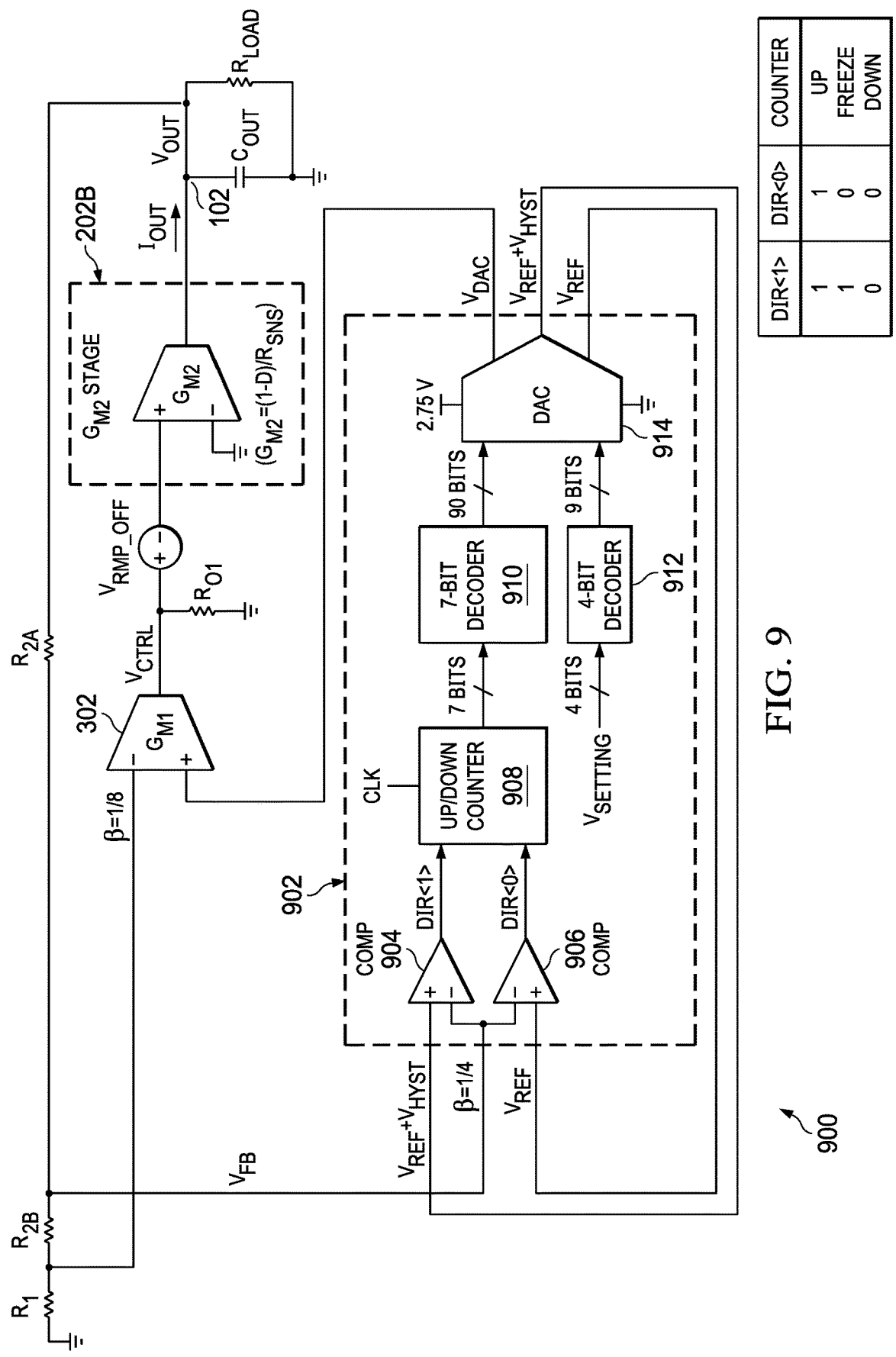

FIG. 9 is a schematic diagram showing another boost converter topology 900 with a digital integrator 902 in accordance with some examples. In the boost converter topology 900, the digital integrator 902 has replaced the analog integrator 402A represented in the boost converter topology 700 of FIG. 7A, or has replaced the digital integrator 702 represented in the boost converter topology 700 of FIG. 7A or the boost converter topology 800 of FIG. 8. Also, the boost converter topology 900 includes a segmented $R_2$ ($R_{2A}$ and $R_{2B}$ in FIG. 9 compared to the boost converter topology 700 of FIG. 7A or the boost converter topology 800 of FIG. 8. In some examples, $R_{2A}=6*R_1$, and where $R_{2B}=R_1$. With $R_{2A}$ and $R_{2B}$, $\beta$ for the digital integrator 902 and 13 for the inner loop are selected. Other components of the boost converter topology 900 were previously introduced in FIGS. 1-5.

In the boost converter topology 900, the digital integrator 902 accounts for the error between $V_{FB}$ and $V_{REF}$ $V_{HYST}$ using a first comparator 904. The digital integrator 902 also accounts for the error between $V_{FB}$ and $V_{REF}$ using a second comparator 906. The outputs of the first and second comparators 904 and 906 are used as control signals ("DIR<1>" from the first comparator 904 and "DIR<2>" from the second comparator 906) for an up/down counter 908. In some examples, the operations of the up/down counter 908 correspond to Table 1 described previously. The output of the up/down counter 708 is input to a first decoder 910 (e.g., 7-bit decoder to convert 7-bits to 90-bits), where the output of the first decoder 910 is input to a DAC 914. In some examples, the DAC 914 also receives the output of a second decoder 912 (e.g., a 4-bit decoder to convert 4-bits to 9-bits), where the input to the second decoder is a $V_{SETTING}$ value. In the example of FIG. 9, $V_{SETTING}$ is a programmable setting to support a $V_{OUT}$ range of 6V-10V (e.g., in 0.5V steps) for the boost converter topology 900. Also, it should be noted that the up/down counter 908 of FIG. 9 is configured to provide a multi-bit value (e.g., a 7-bit value) to the first decoder 910.

Figure 10A:
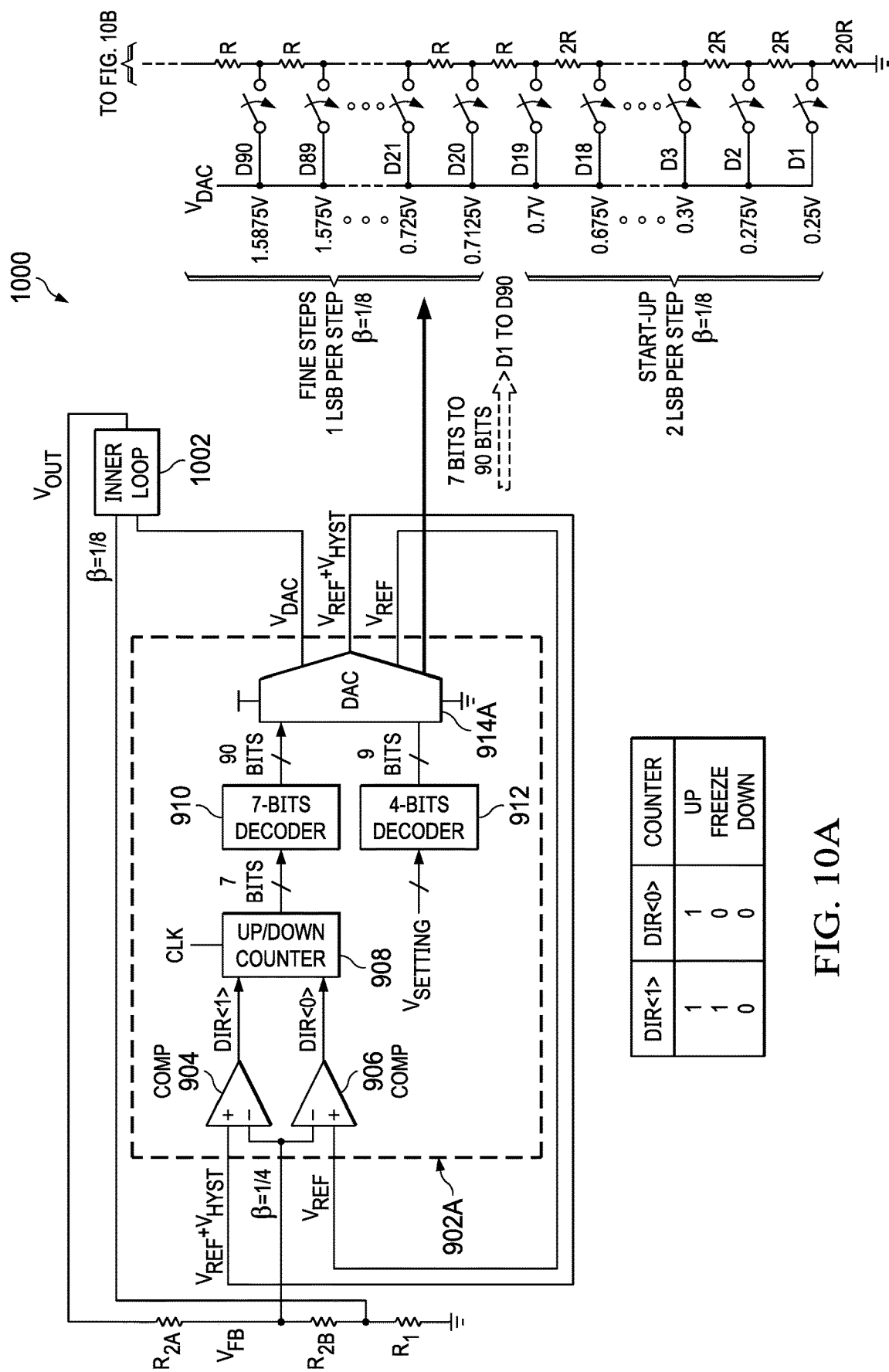
Figure 10B:
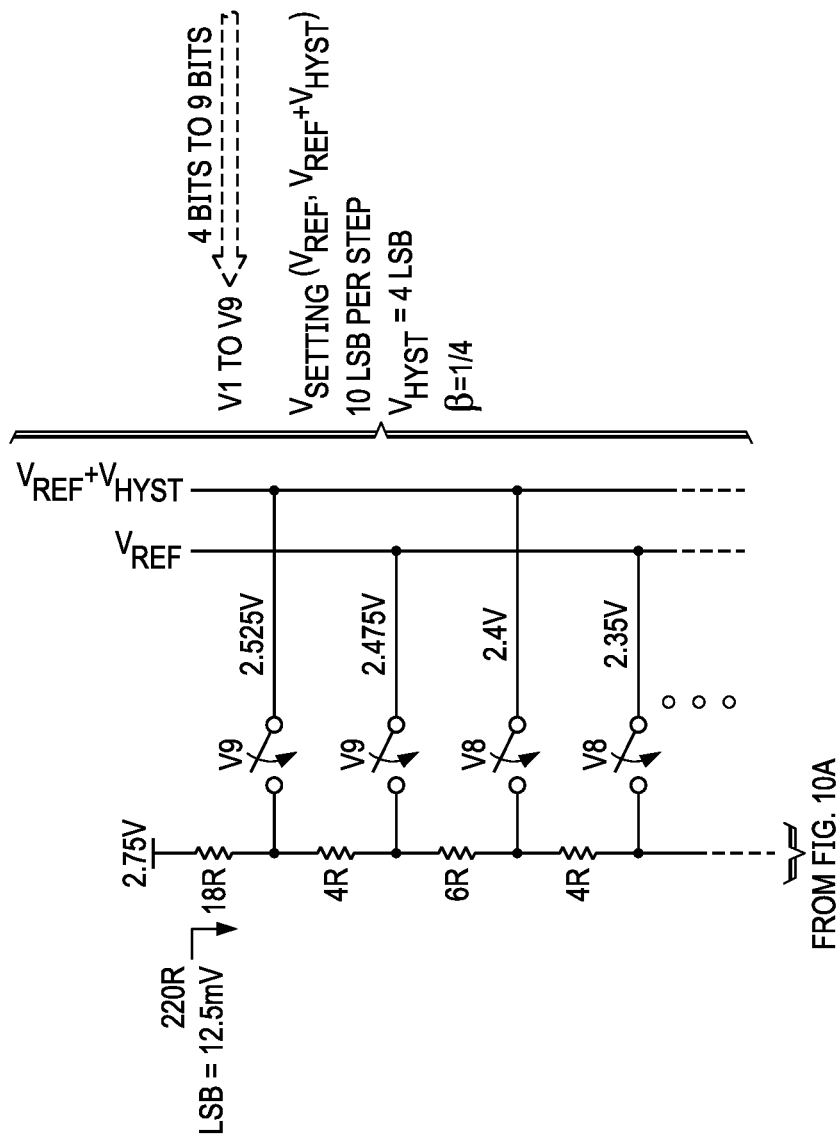

FIGS. 10A and 10B are a schematic diagram showing a boost converter topology 1000 with a digital integrator 902A (an example of the digital integrator 902 in FIG. 9) in accordance with some examples. As shown, the boost converter topology 1000 includes an inner loop circuit 1002 coupled to the digital integrator 902A, where $R_1$, $R_{2A}$, and $R_{2B}$ are used to select 13 for the digital integrator 902A and 13 for the inner loop circuit 1002. In some examples, $R_{2B}=R_1$ and $R_{2A}=6*R_1$.

In the example of FIGS. 10A and 10B, the digital integrator 902A includes a DAC 914A (an example of the DAC 914 in FIG. 9) in the form of a resistor ladder DAC. Also, the DAC 914A uses an LSB of 12.5 mV to generate $V_{DAC}$, $V_{REF}$, and $V_{REF}+V_{HYST}$. In FIG. 10A, it can be seen that there are two loops: the inner loop 1002 and the outer loop corresponding to the digital integrator 902A. The inner loop 1002 uses a beta factor of ⅛ and uses a resistor ladder (string) DAC 914A with an LSB of 12.5 mV to generate $V_{DAC}$. Since the beta factor of the inner loop 1002 is ⅛, an increment in the DAC value by an LSB corresponds to an increment of LSB*8 in the boost output value (e.g., a 12.5 mV step in the DAC 914A corresponds to 12.5 mV*8=100 mV step in the boost output). When the boost converter topology 1000 starts up, initially to have a fast ramp up, the DAC 914A is incremented in 2 LSB steps (25 mV steps) until the DAC value reaches 0.7V and hence the boost output will also get incremented in 200 mV steps (25 mV*8) up to 5.6V (0.7*8). Once the boost output reaches 5.6V, the DAC 914A will then increment in finer 1LSB steps (12.5 mV) and the boost output will also increment in 100 mV steps (12.5 mV*8) until it reaches the programmed value (based on $V_{SETTING}$).

The digital integrator 902A (outer loop) uses a beta factor of ¼ and uses the same resistor string DAC 914A used by the inner loop with an LSB of 12.5 mV. Thus, the DAC 914A is a shared DAC with two outputs. The first output of the DAC 914A is a feedback adjustment signal ($V_{DAC}$), which is used by the inner loop 1002. The other outputs of the DAC 914A include a first control signal ($V_{REF}+V_{HYST}$) and a third control signal ($V_{REF}$) used by the digital integrator 902A. As described herein, $V_{DAC}$ is controlled by the counter value. Meanwhile, the first and second control signals are controlled by $V_{SETTING}$. As an example, if a user needs 6V at the boost output, then the user programs $V_{SETTING}$ as 1.5V (6V/4) since the digital integrator 902A uses a beta factor of ¼. In some examples, even if the DAC 914A has an LSB of 12.5 mV, the user may only be able to program the second output of the DAC 914A in larger steps (e.g., 10LSB steps or 125 mV in this example) and also only in a certain range (e.g., 1.475V to 2.475V).

The programmed voltage selected by $V_{SETTING}$ will be used as $V_{REF}$ by the digital integrator 902A. While $V_{REF}$ is programmable, $V_{REF}+V_{HYST}$ is derived version from $V_{REF}$. In some examples, $V_{HYST}$ is always 50 mV. In such examples, $V_{REF}+V_{HYST}$ is always 50 mV higher than $V_{REF}$ (e.g., 50 mV in the DAC output corresponds to 200 mV (50 mV*4) in boost output because of the beta factor of ¼). Once $V_{SETTING}$ selects the control signals, $V_{REF}$ and $V_{REF}+V_{HYST}$, the output of the boost converter will always settle between $4*V_{REF}$ and $4*(V_{REF}+V_{HYST})$, where the multiplication factor 4 is because of the beta factor of the outer loop which is ¼. For example, if user wants the boost output to settle within 10V+/−0.1V, $V_{SETTING}$ is programmed such that $V_{REF}$ is 2.475V ((10V−0.1V)/4=9.9V/4=2.475V). Once $V_{REF}$ is programmed to 2.475V, $V_{REF}+V_{HYST}$ will automatically be set to 2.525V (2.475V+50 mV), which results in a boost output of 10.1V (2.525V*4=10V+0.1V). As shown in FIG. 10A, both the inner loop 1002 and the digital integrator 902A (outer loop) share the reference DAC as well as the feedback network. This is important because matching is necessary between the two loops for stable operation as both are dependent on each other. In some examples, two DACs (rather than one DAC) are used to provide $V_{DAC}$ and the digital integrator references ($V_{REF}$ and $V_{REF}+V_{HYST}$).

The use of two comparators instead of just one comparator for the proposed digital integrators (e.g., the digital integrator 702 in FIGS. 7A and 8, the digital integrator 902 in FIG. 9, the digital integrator 902A in FIG. 10A) provide have a stable region where a DAC (e.g., the DAC 710 in FIGS. 7A and 8, the DAC 914 in FIG. 9, or the DAC 914A in FIG. 10A) is able to settle without toggling in steady state. With two comparators in the proposed digital integrators, the boost output is able to settle such that $V_{REF}<V_{FB}<V_{REF}+V_{HYST}$, which will hold the counter from counting and freeze the DAC code. In this manner, spurious tones in the boost output are avoided as the LSB of the DAC does not toggle and the proposed digital integrators provide an on-chip solution without the toggling tradeoff. Also, in some examples, the same DAC (e.g., the DAC 914 in FIG. 9, or the DAC 914A in FIG. 10A) is used to generate references for the digital integrator and the inner loop. Also, the proposed digital integrators are able to handle some noise on $V_{REF}$ and $V_{FB}$ (e.g., up to a DAC LSB).

Figure 11:
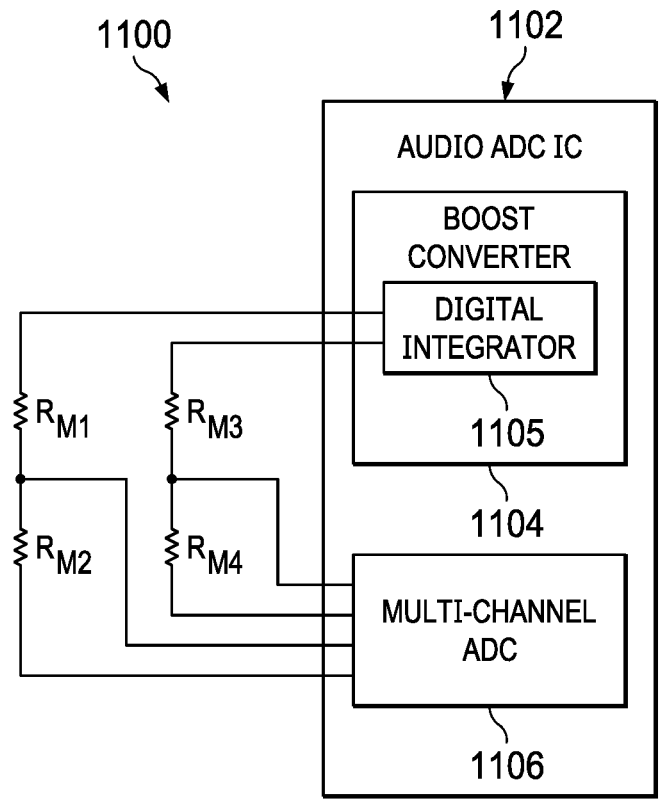
FIG. 11 is a block diagram showing a system in accordance with some examples.

FIG. 11 is a block diagram showing a system 1100 in accordance with some examples. In the example of FIG. 11, the system 1100 includes an audio ADC integrated circuit (IC) or chip 1102 with a boost converter 1004 having a digital integrator 1105 (an example of the digital integrator 702 in FIGS. 7A and 8, the digital integrator 902 in FIG. 9, the digital integrator 902A in FIG. 10A), where the digital integrator 1104 is based in part on two comparators as described herein. The audio ADC IC or chip 1102 also includes a multi-channel (e.g., 4-channel) ADC 1106. In some examples, the boost converter 1004 is used to power microphones, which are represented as resistors ($R_{M1}$–$R_{M4}$) in FIG. 11. In operation, the multi-channel ADC 1106 is able to digitize the audio from the microphones, which are powered by the boost converter 1104. In an audio ADC scenario, a boost converter with the proposed digital integrator enables an on-chip solution that avoids adding undesirable noise to the digitized audio from the microphones.

In some examples, an electrical device (e.g., an audio ADC device) includes an integrated circuit (e.g., the IC or chip 1102 of FIG. 11) having device circuitry (e.g., the multi-channel ADC 1106 of FIG. 11) and a boost converter (e.g., the boost converter 1104 of FIG. 11) coupled to the device circuitry. The boost converter comprises a digital integrator circuit (e.g., the digital integrator 702 in FIGS. 7A and 8, the digital integrator 902 in FIG. 9, the digital integrator 902A in FIG. 10A), where the digital integrator circuit includes a first comparator (e.g., the first comparator 704 in FIGS. 7A and 8, or the first comparator 904 in FIGS. 9 and 10A) and a second comparator (e.g., the second comparator 706 in FIGS. 7A and 8, or the second comparator 906 in FIGS. 9 and 10A). The digital integrator circuit also includes a counter (e.g., the counter 708 in FIGS. 7A and 8, or the counter 908 in FIGS. 9 and 10A) configured to count up, count down, and pause based on a first output signal (e.g., DIR<1> in FIGS. 7A, 8, 9, and 10A) provided by the first comparator and based on a second output signal (e.g., DIR<0> in FIGS. 7A, 8, 9, and 10) provided by the second comparator. The digital integrator circuit also a DAC (e.g., the DAC 710 in FIGS. 7A and 8, the DAC 914 in FIG. 9, or the DAC 914A in FIG. 10A) configured to provide a feedback adjustment signal (e.g., $V_{DAC}$) for the boost converter based on a count value provided by the counter.

In some examples, the first comparator is configured to provide the first output signal based on a comparison of a first input signal and a second input signal, wherein the first input signal combines a reference voltage (e.g., $V_{REF}$) with a hysteresis voltage (e.g., $V_{HYST}$), and wherein the second input signal is a feedback voltage (e.g., $V_{FB}$) proportional to an output voltage of the boost converter. In some examples, the second comparator is configured to provide the second output signal based on a comparison of a third input signal and the second input signal, wherein the third input signal is the reference voltage (e.g., $V_{REF}$). In some examples, the DAC is configured to provide the first input signal to the first comparator and to provide the third input signal to the second comparator.

In some examples, the digital integrator circuit also includes: a first decoder (e.g., the first decoder 910 in FIGS. 9 and 10A) between the counter and the DAC, wherein the first decoder is configured to drive the DAC to provide the feedback adjustment signal (e.g., $V_{DAC}$) based on the count value; and a second decoder (e.g., the second decoder 912 in FIGS. 9 and 10A) coupled to the DAC, wherein the second decoder is configured to drive the DAC to provide the first input signal and the third input signal based on a programmable setting (e.g., $V_{SETTING}$ in FIGS. 9 and 10A). In some examples, the DAC is a first DAC, and the digital integrator circuit also includes: a first decoder (e.g., the first decoder 910 in FIGS. 9 and 10A) between the counter and the first DAC, wherein the first decoder is configured to drive the first DAC to provide the feedback adjustment signal (e.g., $V_{DAC}$ in FIGS. 9 and 10A) based on the count value; and a second decoder (e.g., the second decoder 912 in FIGS. 9 and 10A) coupled to a second DAC, wherein the second decoder is configured to drive the second DAC to provide the first input signal and the third input signal based on a programmable setting (e.g., $V_{SETTING}$ in FIGS. 9 and 10A).

In some examples, the DAC is a resistor ladder DAC (e.g., the DAC 914A in FIG. 10A). In some examples, the counter is configured to receive a clock signal (e.g., CLK in FIGS. 9 and 10A), wherein a period of the clock signal is programmable and is selected to be at least 5 times higher than a worst case time constant of an inner loop (e.g., the inner loop 1002 in FIG. 10A) of the boost converter. In some examples, the inner loop corresponds to a first transconductance stage (e.g., $G_{M1}$ in FIG. 9), a first resistor (e.g., $R_{O1}$ in FIG. 9), a ramp offset source ($V_{RMP\_OFF}$ in FIG. 9), a second transconductance stage (e.g., $G_{M2}$ in FIG. 9), and voltage divider resistors (e.g., R1, $R_{2A}$, $R_{2B}$ in FIG. 9).

In some examples, the DAC is a first DAC (e.g., a first DAC configured to provided $V_{DAC}$), and wherein the electrical device further comprises a second DAC configured to provide the first input signal and the third input signal (e.g., a second DAC configured to provided $V_{REF}$ and $V_{REF}$+$V_{HYST}$). In some examples, the device circuitry comprises audio ADC circuitry (e.g., the multi-channel ADC 1106 in FIG. 11).

In some examples, a boost converter circuit includes a power switch (e.g., M1 in FIG. 2, represented as $G_M$ stage 202B in FIGS. 7A, 8, 9, and 10A). The boost converter circuit also includes a control circuit (e.g., inner loop 1002 in FIG. 10A or related components in FIGS. 7A, 8, and 9) coupled to the power switch. The control loop includes a digital integrator circuit (e.g., the digital integrator 702 in FIGS. 7A and 8, the digital integrator 902 in FIG. 9, the digital integrator 902A in FIG. 10A) having a first comparator (e.g., the first comparator 704 in FIGS. 7A and 8, or the first comparator 904 in FIGS. 9 and 10A) with input nodes and an output node. The digital integrator circuit also includes a second comparator (e.g., the second comparator 706 in FIGS. 7A and 8, or the second comparator 906 in FIGS. 9 and 10A) with two input nodes and an output node. The digital integrator circuit also includes a counter (e.g., the counter 708 in FIGS. 7A and 8, or the counter 908 in FIGS. 9 and 10A) with a first input node coupled to the output node of the first comparator and with a second input node coupled to the output node of the second comparator. The digital integrator circuit also includes a DAC (e.g., the DAC 710 in FIGS. 7A and 8, the DAC 914 in FIG. 9, or the DAC 914A in FIG. 10A) coupled to an output node of the counter, wherein an output of the DAC is a feedback adjustment signal (e.g., $V_{DAC}$ in FIGS. 7A, 8, 9, and 10A) used by the control circuit to determine an on-time for the power switch.

In some examples. the output node of the first comparator provides a first control signal (e.g., DIR<1> in FIGS. 7A, 8, 9, and 10A) to the counter based on a comparison of a first input signal and a second input signal, wherein the first input signal combines a reference voltage (e.g., $V_{REF}$) with a hysteresis voltage (e.g., $V_{HYST}$), and wherein the second input signal is a feedback voltage (e.g., $V_{FB}$) proportional to an output voltage of the boost converter circuit. In some examples, the output node of the second comparator provides a second control signal (e.g., DIR<0> in FIGS. 7A, 8, 9, and 10A) to the counter based on a comparison of a third input signal and the second input signal, wherein the third input signal is the reference voltage. In some examples, the DAC is configured to provide the first input signal to the first comparator and to provide the third input signal to the second comparator.

In some examples, the DAC comprises a resistor ladder DAC (e.g., DAC 914A in FIG. 10A) with a plurality of resistors and respective switches (e.g., the resistors and switches represented in FIGS. 10A and 10B), and wherein the boost converter circuit also includes a first decoder (e.g., the first decoder 910 in FIGS. 9 and 10A) coupled between the output node of the counter and the DAC, wherein the first decoder is configured to close some of a first set of the respective switches to provide the feedback adjustment signal (e.g., $V_{DAC}$ in FIGS. 9 and 10A) based on a count value at the output node of the counter. The boost converter circuit also includes a second decoder (e.g., the second decoder 912 in FIGS. 9 and 10A) coupled to the DAC, wherein the second decoder is configured to close some of a second set of the respective switches to provide the first input signal and the third input signal based on a programmable setting (e.g., $V_{SETTING}$ in FIGS. 9 and 10A).

In some examples, the DAC is a first DAC, and the boost converter circuit also includes a second DAC (e.g., use two DACs instead of DAC 914 or 914A in FIGS. 9 and 10A). The boost converter circuit also includes a first decoder (e.g., the first decoder 910 in FIGS. 9 and 10A) between the output node of the counter and the first DAC, wherein the first decoder is configured to drive the first DAC to provide the feedback adjustment signal (e.g., $V_{DAC}$ in FIGS. 9 and 10A) based on a count value at the output node of the counter. The boost converter circuit also includes a second decoder (e.g., the second decoder 912 in FIGS. 9 and 10A) coupled to the second DAC, wherein the second decoder is configured to drive the second DAC to provide the first input signal and the third input signal based on a programmable setting (e.g., $V_{SETTING}$ in FIGS. 9 and 10A). In some examples, the counter is configured to receive a clock signal (e.g., CLK in FIGS. 9 and 10A), wherein a period of the clock signal is programmable and is selected to be at least 5 times higher than a worst case time constant of an inner loop (e.g., the inner loop 1002 in FIG. 10A) of the boost converter. In some examples, the inner loop corresponds to a first transconductance stage (e.g., $G_{M1}$ in FIG. 9), a first resistor (e.g., $R_{O1}$ in FIG. 9), a ramp offset source ($V_{RMP\_OFF}$ in FIG. 9), a second transconductance stage (e.g., $G_{M2}$ in FIG. 9), and voltage divider resistors (e.g., R1, $R_{2A}$, $R_{2B}$ in FIG. 9).

Figure 12:
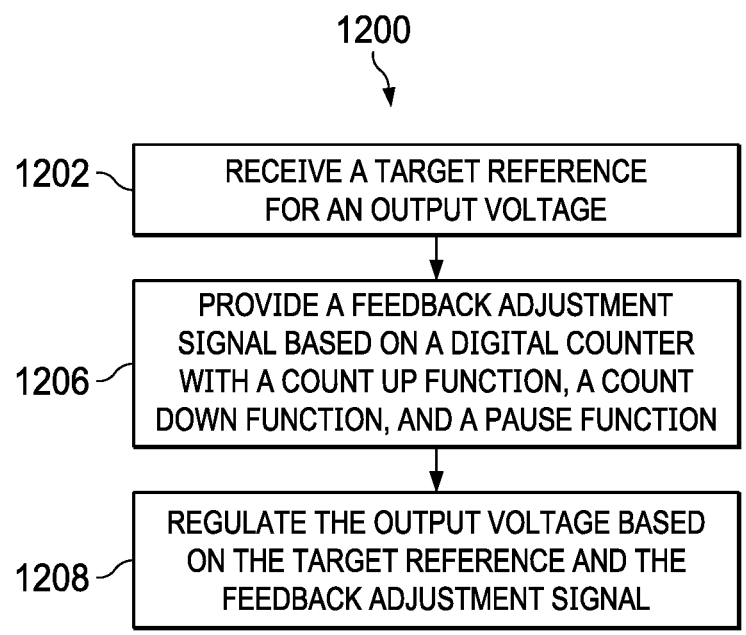
FIG. 12 is a flowchart showing a method in accordance with some examples.

FIG. 12 is a flowchart showing a method 1200 in accordance with some examples. As shown, the method 1200 comprises receiving a target reference ($V_{REF}$) for an output voltage ($V_{OUT}$) at block 1202. At block 1206, a feedback adjustment signal ($V_{DAC}$) is provided based on a digital counter with a count up function, a count down function, and a pause function. At block 1208, the output voltage is regulated based on the target reference and the feedback adjustment signal.

In some examples, providing the feedback adjustment signal at block 1206 includes providing a first comparator output based on a comparison of a first input signal and a second input signal, wherein the first input signal combines a reference voltage with a hysteresis voltage, and wherein the second input signal is the feedback voltage. In some examples, providing the feedback adjustment signal at block 1206 also includes providing a second comparator output based on a comparison of the second input signal and a third input signal, wherein the third input signal is the reference voltage. In some examples, providing the feedback adjustment signal at block 1206 also includes providing the first and second output comparator outputs to the digital counter to direct the digital counter to perform one of the count up function, the count down function, and the pause function. In some examples, the method 1200 also includes using a resistor ladder DAC to output the first input signal and the third input signal based on a programmable setting (e.g., $V_{SETTING}$ in FIGS. 9 and 10A). In some examples, the method 1200 includes using the resistor ladder DAC to output to output the feedback adjustment signal (e.g., $V_{DAC}$ in FIG. 9) based on an output of the digital counter.

In some examples, the method 1200 also includes using a first DAC to output the feedback adjustment signal (e.g., $V_{DAC}$ in FIG. 9) based on an output of the digital counter. The method also includes using a second DAC to output the first input signal and the third input signal based on a programmable setting (e.g., $V_{SETTING}$ in FIGS. 9 and 10A). In some examples, the method 1200 includes selecting a period of a clock signal input to the counter to be at least 5 times higher than a worst case time constant of the inner loop (e.g., the inner loop 1002 in FIG. 10A) of the boost converter. In some examples, the inner loop corresponds to a first transconductance stage (e.g., $G_{M1}$ in FIG. 9), a first resistor (e.g., $R_{O1}$ in FIG. 9), a ramp offset source ($V_{RMP\_OFF}$ in FIG. 9), a second transconductance stage (e.g., $G_{M2}$ in FIG. 9), and voltage divider resistors (e.g., R1, $R_{2A}$, $R_{2B}$ in FIG. 9).

In contrast to other integrator options (e.g., using an analog capacitor, an on-chip capacitor, and/or a capacitor multiplier with active circuitry), the proposed digital integrator solution uses two simple comparators and a soft-start extension to ramp the reference voltage to the programmed value (as described for FIGS. 10A and 10B). This proposed digital integrator solution does not need extra circuitry and simply reuses the existing DAC and counter used in soft-start along with two comparators. With the proposed digital integrator solution, switching converter overshoot (in the output voltage) is avoided as with each DAC step, the boost will reach steady state and will settle as the inner loop is a first order system. Another benefit is the avoidance of overvoltage protection components, since the output voltage will be limited by the highest voltage level of the DAC. By comparison, in an analog implementation, output voltage overshoot depends on the phase margin, which involves a separate comparator to limit the overshoot. The use of two comparators for the proposed digital integrator converts the open loop soft start into a closed loop regulator. These comparators monitor the boost output and close the loop.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An electrical device, comprising: an integrated circuit having: device circuitry; and a boost converter coupled to the device circuitry, wherein the boost converter comprises a digital integrator circuit having: a first comparator; a second comparator; a counter configured to count up, count-down, and pause based on a first output signal provided by the first comparator and based on a second output signal provided by the second comparator; a digital-to-analog converter (DAC) configured to provide a feedback adjustment signal for the boost converter based on a count value provided by the counter, a first decoder coupled between the counter and the DAC; and a second decoder coupled to the DAC.

2. The electrical device of claim 1, wherein:
the first decoder is configured to drive the DAC to provide the feedback adjustment signal based on the count value; and
the second decoder is configured to drive the DAC to provide input signals to the first and second comparators, respectively, based on a programmable setting.

3. An electrical device, comprising:
an integrated circuit having:
device circuitry; and
a boost converter coupled to the device circuitry, wherein the boost converter comprises a digital integrator circuit having:
a first comparator;
a second comparator;
a counter configured to count up, count down, and pause based on a first output signal provided by the first comparator and based on a second output signal provided by the second comparator;
a first digital-to-analog converter (DAC) configured to provide a feedback adjustment signal for the boost converter based on a count value provided by the counter;
a first decoder between the counter and the first DAC, wherein the first decoder is configured to drive the first DAC to provide the feedback adjustment signal based on the count value; and
a second decoder coupled to a second DAC, wherein the second decoder is configured to drive the second DAC to provide input signals to the first and second comparators, respectively, based on a programmable setting.

4. The electrical device of claim 1, the DAC is a resistor ladder DAC.

5. The electrical device of claim 1, wherein the counter is configured to receive a clock signal, and wherein a period of the clock signal is programmable and is set based on a time constant of an inner loop of the boost converter.

6. The electrical device of claim 1, the DAC is a first DAC, and wherein the digital integrator circuit further comprises a second DAC configured to provide input signals to the first and second comparators, respectively.

7. The electrical device of claim 1, wherein the device circuitry comprises audio analog-to-digital converter (ADC) circuitry.

8. A boost converter circuit, comprising:
a control circuit with an inner loop and an outer loop, wherein the outer loop comprises:
a digital integrator circuit having:
a first comparator with input nodes configured to receive first and second input signals, and an output node configured to output a first comparison signal indicative of a comparison of the first and second input signals;

a second comparator with input nodes configured to receive third and fourth input signals, and an output node configured to output a second comparison signal indicative of a comparison of the third and fourth input signals;

a counter with a first input node coupled to the output node of the first comparator and with a second input node coupled to the output node of the second comparator, the counter configured to receive the first and second comparison signals at the first and second input nodes respectively; and a digital-to-analog converter (DAC) coupled to an output node of the counter, wherein an output of the DAC is a feedback adjustment signal used by the control circuit to determine an on-time for a power switch.

9. The boost converter circuit of claim 8, wherein the counter is configured to receive a clock signal, and wherein a period of the clock signal is programmable and is set based on a time constant of an inner loop of the boost converter circuit.

10. A method, comprising:

receiving a target reference for an output voltage of a boost converter;

providing a feedback adjustment signal for an inner loop of the boost converter based on a digital counter with a count up function, a count down function, and a pause function, the feedback adjustment signal based on a reference voltage, a hysteresis voltage and a feedback voltage proportional to the output voltage of the boost converter; and regulating the output voltage of the boost converter based on the target reference and the feedback adjustment signal.

11. The method of claim 10, further comprising selecting a period of a clock signal input to the counter based on a time constant of the inner loop of the boost converter.

* * * * *